United States Patent
Shiraki et al.

(10) Patent No.: US 8,466,602 B2
(45) Date of Patent: Jun. 18, 2013

(54) LINEAR DRIVING DEVICE

(75) Inventors: Manabu Shiraki, Kanagawa (JP); Junichi Tada, Kanagawa (JP)

(73) Assignee: New Shicoh Technology Co., Ltd., Kanagawa (JP)

(*) Notice: Subject to any disclaimer, the term of this patent is extended or adjusted under 35 U.S.C. 154(b) by 0 days.

(21) Appl. No.: 12/913,121

(22) Filed: Oct. 27, 2010

(65) Prior Publication Data

US 2011/0101826 A1    May 5, 2011

(30) Foreign Application Priority Data

Oct. 29, 2009 (JP) .................................. 2009-248490

(51) Int. Cl.
*H02N 2/04* (2006.01)

(52) U.S. Cl.
USPC ................... 310/323.02; 310/313 R; 310/344

(58) Field of Classification Search
USPC .................. 310/323.02, 313 R, 344
See application file for complete search history.

(56) References Cited

U.S. PATENT DOCUMENTS

| | | | |
|---|---|---|---|
| 2005/0040732 A1* | 2/2005 | Tsukimoto et al. | 310/323.02 |
| 2006/0086065 A1* | 4/2006 | Tomalesky et al. | 53/425 |
| 2006/0220497 A1* | 10/2006 | Okamoto et al. | 310/328 |
| 2006/0261706 A1* | 11/2006 | Yoon et al. | 310/328 |
| 2008/0265714 A1* | 10/2008 | Morioke | 310/315 |
| 2008/0315721 A1* | 12/2008 | Wada et al. | 310/323.02 |
| 2009/0127974 A1* | 5/2009 | Piotr et al. | 310/317 |

FOREIGN PATENT DOCUMENTS

JP    2008-259345    10/2008

* cited by examiner

*Primary Examiner* — Walter Benson
*Assistant Examiner* — Bryan Gordon
(74) *Attorney, Agent, or Firm* — Dilworth & Barrese, LLP.

(57) ABSTRACT

In a linear driving device 7, in which a driving shaft 21 vibrates in an axial direction by a vibration member 17, as a result of which a movable body 3 that is frictionally contact with the driving shaft 21 slides along the axial direction of the driving shaft 21, the vibration member 17 includes a piezoelectric element 23 and a vibrator 19 made of a metal plate having elasticity; the vibrator 19 is fixed to the piezoelectric element 23 by superimposing plate faces thereof; the driving shaft 21 has a trunk 25 along which the movable body 3 slides, and an end portion 26 to be fixed to the vibrator 19; a base surface 24 of the end portion 26 abuts with and is fixed to the vibrator 19; and an area of the base surface 24 is smaller than a cross sectional area of the trunk 25.

3 Claims, 4 Drawing Sheets

(a)

(b)

LINEAR DRIVING DEVICE

This application is based on and claims the benefit of priority from Japanese Patent Application No. 2009-248490, filed on 29 Oct. 2009, the content of which is incorporated herein by reference.

BACKGROUND OF THE INVENTION

1. Field of the Invention

The present invention relates to a linear driving device, in which a movable body is linearly moved.

2. Related Art

Patent Document 1 discloses a linear driving device, in which an end of a driving shaft is fixed to a vibration member, with a metal vibrator having elasticity being superimposed on and fixed to a piezoelectric element, and by vibrating the driving shaft in an axial direction, a movable body in frictional contact with the driving shaft is linearly moved.

Moreover, in this type of conventional linear driving device, in general, as shown in FIG. 4, an end face of a driving shaft 51 having a cylindrical shape is fixed to the center of a plane of a plate-like vibrator 55 that is superimposed on a piezoelectric element 53.

Patent Document 1: Japanese Unexamined Patent Application Publication No. 2008-259345

In recent years, in this type of linear driving device, it is required to reduce the size of the device, while obtaining predetermined driving torque without changing level of driving power and characteristic of the piezoelectric element.

In order to address such a demand, the present inventors have conducted studies and experiments, and have found as a result that, in a vibration member composed of a piezoelectric element and a vibrator, torque acting on a movable body frictionally contact with a driving shaft mainly depends on deformation of the vibrator that elastically deforms due to mass of the driving shaft and expansion and contraction of the piezoelectric element.

In other words, torque F acting on the movable body due to vibration of the driving shaft can be generally obtained by the expression, F=ma. Here, m is mass, and a is acceleration.

Therefore, where the mass of the driving shaft is m, the acceleration a is acceleration when the vibrator elastically deforms; accordingly, the present inventors have conducted studies aiming at reducing the size of the vibration member, while obtaining predetermined acceleration (elastic deformation) a in the vibrator, with little change of the mass m of the driving shaft.

An object of the present invention is to provide a linear driving device, in which size reduction of the device can be achieved, while obtaining predetermined driving torque without changing level of driving power and characteristic of the piezoelectric element.

SUMMARY OF THE INVENTION

The present invention provides a linear driving device, in which a movable body that is frictionally contact with a driving shaft slides along an axial direction of the driving shaft, the linear driving device includes: a vibration member including a piezoelectric element that expands and contracts by applying electricity, and a vibrator made of a metal plate having elasticity, in which the vibrator is fixed to the piezoelectric element by superimposing plate faces thereof; and a driving shaft having end fixed to the vibration member, which vibrates in the axial direction due to vibration of the vibration member; in which the driving shaft has a trunk along which the movable body slides, and an end portion fixed to the vibrator, a base surface of the end portion abuts with and is fixed to the vibrator, and the area of the base surface is smaller than the cross sectional area of the trunk.

The present inventors have found that, in a case in which the end face of the driving shaft abuts with and is fixed to a vibration plane of the vibrator, a portion of the driving shaft abutting with and fixed to the vibrator does not contribute to deformation (vibration) of the vibrator, but a region where the driving shaft does not abut with and is not fixed to the vibrator contributes to the vibration.

Therefore, according to the present invention, the area where the driving shaft abuts with and is fixed to the vibrator is smaller than that in conventional cases, as a result of which the area of the vibrator contributing to deformation (vibration) of the vibrator can be increased correspondingly, and thus predetermined vibration can be obtained even if the entire area of the vibrator is reduced.

In other words, according to the present invention, the proportion of the area that contributes to deformation of the vibrator can be increased as compared to the conventional cases; therefore, the area of the vibrator can be reduced while obtaining predetermined vibration.

Moreover, with regard to the driving shaft, the cross sectional area of only the end portion may be made thinner, and thus the mass of the driving shaft receives almost no effect, and the vibration member can be made smaller with little influence on the torque that acts on the movable body.

In the present invention, it is preferable that the driving shaft is fixed to the vibrator by way of a bonding agent, and the bonding agent is packed between the base end portion of the driving shaft and the vibrator.

In a case in which the end portion of the driving shaft is fixed to the vibrator by way of the bonding agent, a portion thus bonded has an adverse effect on deformation of the vibrator; however, as shown in (a) of FIG. 1, a portion of the bonding agent running off the driving shaft can be reduced as compared to the conventional case shown in FIG. 4; and therefore, the adverse effect on deformation of the vibrator due to the bonding can be reduced.

Since the bonding agent is bonded to an inclined face where the diameter of the driving shaft is small, the area of bonding with the driving shaft can be increased as compared to the conventional case, and thus strong bonding can be achieved.

In the present invention, it is preferable that the movable body is a lens support that supports a lens, and the lens support is moved in an optical axis direction of the lens by way of vibration of the vibration member.

The linear driving device according to the present invention can be used as a lens driving device of a camera, as a result of which size reduction of the camera can be achieved.

DETAILED DESCRIPTION OF THE INVENTION

An embodiment of the present invention is hereinafter described with reference to FIGS. 1 to 3. A linear driving device according to the present embodiment is a linear driving device 7 that drives a lens of an autofocus camera 1 having an optical zoom function, which is incorporated into a cellular phone.

Figure 2:
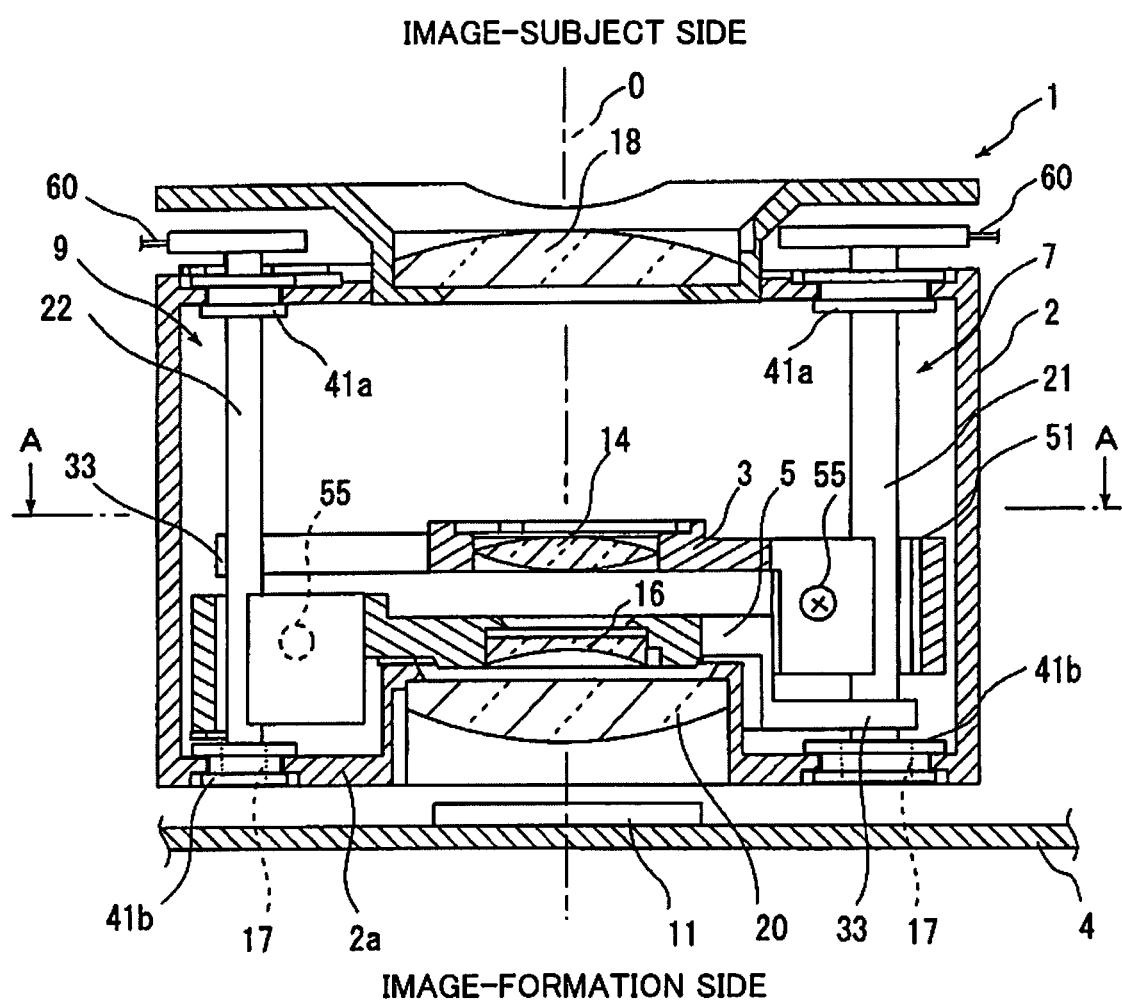
FIG. 2 is a vertical cross-sectional view showing a configuration of a camera according to the present embodiment.

As shown in FIG. 2, the camera 1 according to the present embodiment includes, in a casing 2: a zoom lens holder (movable body) 3; a focus lens holder (movable body) 5; a zoom lens holder driving means (linear driving device) 7 that drives the zoom lens holder 3; a focus lens holder driving means (linear driving device) 9 that drives the focus lens holder 5; and a substrate 4 on which an image sensor 11 is provided. Furthermore, as shown in FIG. 3, a zoom lens position detecting means 43 that detects a position of the zoom lens holder 3, and a focus lens position detecting means 45 that detects a position of the focus lens holder 5 are provided inside the casing 2.

The zoom lens holder 3 holds an optical zoom lens 14, the focus lens holder 5 holds a focus lens 16, the optical zoom lens 14 and the focus lens 16 share the same optical axis 0, and the image sensor 11 is provided at an image-formation position on the optical axis 0. Furthermore, an image-subject side lens 18 and an image-formation side lens 20 are provided inside the casing 2 so as to share the identical optical axis 0 with the zoom lens 14 and the focus lens 16. It should be noted that, in the present embodiment, the image-subject side is a telephotographic side of the optical zoom, and the image-formation side is an enlargement side of the optical zoom.

Since the zoom lens driving means (linear driving device) 7 and the focus lens driving means (linear driving device) 9 have substantially the same configuration, the zoom lens driving means 7 is described, and since the same reference symbols are assigned to portions of the focus lens driving means 9 that realize the same operational effect, a description of the portions is omitted.

The zoom lens driving means 7 is configured with a vibration member 17 that is disposed on a base 2a of the casing 2, and a driving shaft 21 (22) that is disposed in the optical axis direction, in which an end of the driving shaft 21 (22) is fixed to the vibration member 17.

Figure 1:
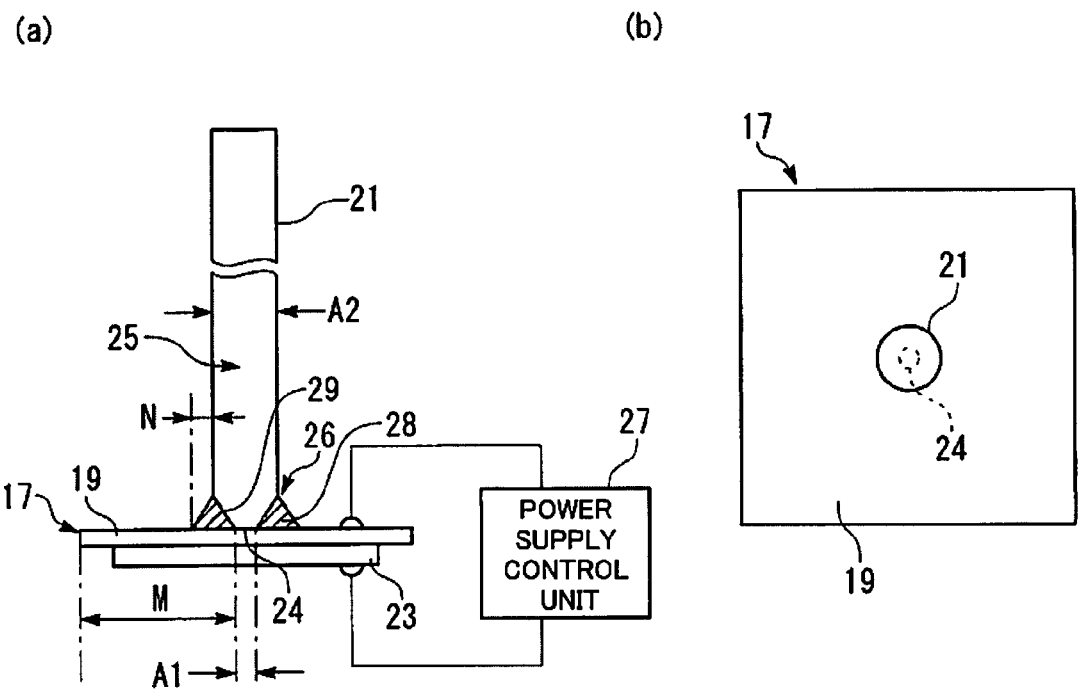
FIG. 1 is a diagram showing a schematic configuration of a linear driving device according to an embodiment of the present invention, in which (a) is a vertical cross-sectional view, and (b) is a plan view from an extremity of a driving shaft.

As shown in FIG. 1, the vibration member 17 is configured with a piezoelectric element 23 and a vibrator 19 that is fixed by bonding to an image-subject side (driving shaft side) face of the piezoelectric element 23.

The piezoelectric element 23 is rectangular in a plan view, and terminals of a power supply control unit 27 are connected to the piezoelectric element 23. The thickness of the piezoelectric element is about 0.15 mm.

The vibrator 19 is rectangular in a plan view, having an area larger than that of the piezoelectric element 23 (see (b) of FIG. 1), and is superimposed on and fixed by bonding to the piezoelectric element 23. The vibrator 19 is a metal plate having elasticity, and in the present embodiment, it is a copper plate formed with a substantially uniform thickness (about 0.15 mm) over the entire plate. The terminals of the power supply control unit 27 are connected to the vibrator 19.

As shown in (a) of FIG. 1, an end portion 26 of the driving shaft 21 is fixed by bonding to a substantially central portion on the inner circumferential side of the vibrator 19, and a base surface 24 of the driving shaft 21 abuts with and is fixed to the vibrator 19.

The driving shaft 21 is made of carbon, has a long and cylindrical shape in an axial direction, and has a trunk 25 along which the zoom lens holder (movable body) 3 slides, and the end portion 26 that is fixed to the vibrator 19, in which the end portion 26 is tapered such that a diameter thereof is gradually reduced toward the end.

An area A1 of the base surface 24 of the driving shaft 21 is smaller than a cross sectional area A2 of the trunk 25, and A1 is substantially half of A2 in the present embodiment.

By packing with a bonding agent 28 between the vibrator 19 and the end portion 26 of the driving shaft 21, the driving shaft 21 is fixed by bonding to the vibrator 19.

As shown in FIG. 2, a tip of the driving shaft 21 is held in the casing 2 by being inserted into a retainer 41a that is fixed to the casing 2, and the vibration member 17 is also held in the casing 2 by way of a retainer 41b.

Figure 3:
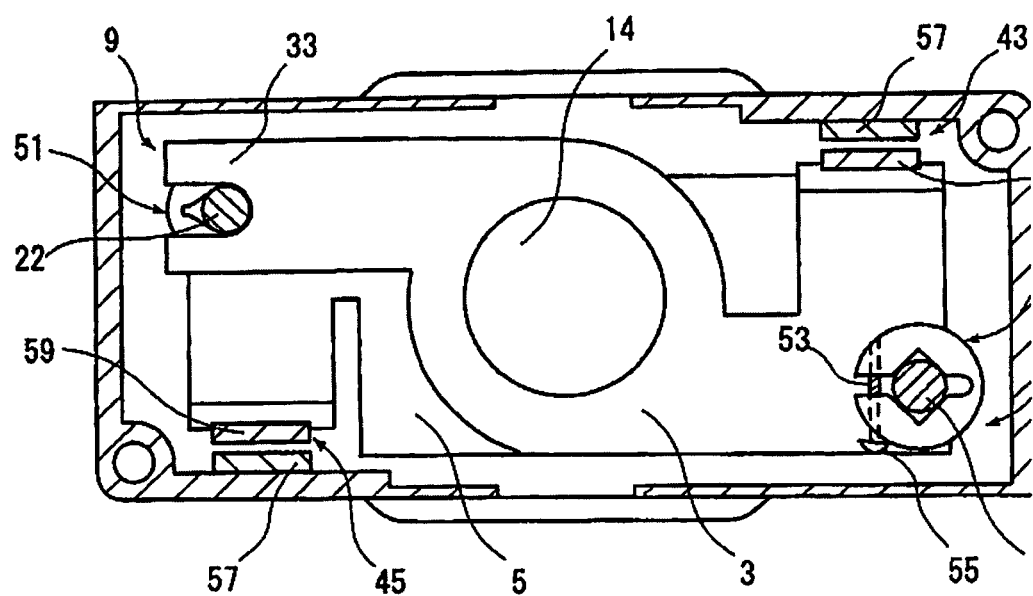
FIG. 3 is a cross-sectional view along a line A-A shown in FIG. 2.

A resin or metal contact portion 51 that is pressed contact with the trunk 25 of the driving shaft 21 (see (a) of FIG. 1) is provided to one end of the zoom lens holder 3; in the contact portion 51, as shown in FIG. 3, an opening 53 is formed on one side surrounding the driving shaft 21; and the opening 53 adjusts a gap of the opening 53 by way of a screw 55, so that friction (pressure) between the contact portion 51 and the driving shaft 21 can be freely adjusted. It should be noted that, without providing the screw 55, predetermined friction may be given by utilizing elasticity of the contact portion 51, or pressed contact may be performed by causing the screw to abut with the driving shaft 21.

A cross section of the inner periphery of the contact portion 51 is polygonal, and is a rectangular hole in the present embodiment, and point contact is established between the inner periphery of the cross section and the circular driving shaft 21. In this way, such point contact can allow powder or dust, which is produced through friction between the driving shaft 21 and the contact portion 51 of the zoom lens holder 3, to escape to a contactless portion; therefore, the reliability of the driving can be enhanced.

An frictionally contact portion 33 is frictionally contact with the driving shaft 22 of the focus lens holder 5 is provided to another end portion of the zoom lens holder 3, and the frictionally contact portion 33 is frictionally contact with and supported by the driving shaft 22 of the focus lens holder, and guides the movement of the zoom lens holder 3. A cross section of the frictionally contact portion 33 substantially forms a letter U shape, and the driving shaft 22 of the focus lens holder 5 is inserted into the letter U shape.

A configuration of the focus lens holder 5 is the same as the configuration of the zoom lens holder 3, and an end of the driving shaft 22 of the focus lens holder 5 is attached to the vibration member 17, similarly to the driving shaft 21 of the zoom lens holder 3.

Here, with reference to FIG. 3, a description is given for the zoom lens position detecting means 43 that detects a position of the zoom lens holder 3, and the focus lens position detecting means 45 that detects a position of the optical focus lens holder 5. The zoom lens position detecting means 43 and the focus lens position detecting means 45 have the same configuration, each of which is configured with: a magnetic pole member 57 in which different magnetic poles (the south pole and the north pole) are alternately arranged along the optical axis 0 direction of the lens; and an MR sensor 59 that detects magnetic-field intensity. The MR (magneto resistive) sensor 59 is fixed to each of the holders 3 and 5, moves together with each of the holders 3 and 5, and is capable of detecting an amount and direction of movement from a reference position (or an initial position) of each holder. A position information signal of each MR sensor 59 is transmitted to a position control unit via a flexible wiring board 60.

Next, operations and effects of the present embodiment are described. In the present embodiment, the magnification is changed by way of optical zoom by moving the zoom lens holder 3, and the focal distance is adjusted by moving the focus lens holder 5.

In a case in which the zoom lens holder 3 is moved to the telephotographic side (image-subject side), electric current of a predetermined pulse is supplied to the piezoelectric element 23 of the vibration member 17, and expansion and contraction of the piezoelectric element 23 are amplified by way of the vibrator 19 to create vibration. When the pulsed current is supplied to the piezoelectric element 23, the piezoelectric element 23 deforms so as to protrude to the front side, the driving shaft 21 deforms to the front side, and the zoom lens holder 3 moves to the front side due to a friction force between the contact portion 51 and the driving shaft 21. Next, when the piezoelectric element 23 contracts, although the vibrator 19 tends to rapidly return to the original position due to a reaction force as a result of elastic deformation thereof, the vibrator 19 deforms into a concave shape due to an inertia force, and rapidly moves to the back side. As a result of repeating such deformation behavior of the vibrator 19, the zoom lens holder 3 moves forward along the driving shaft 21.

Figure 4:
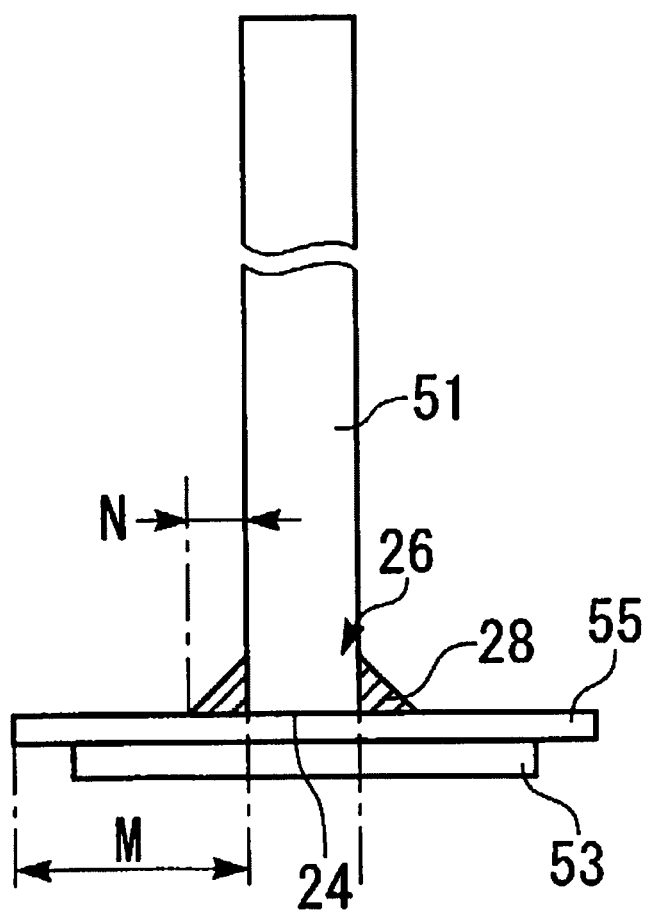
FIG. 4 is a vertical cross-sectional view showing a schematic configuration of a conventional linear driving device.

Here, the deformation of the vibrator 19 is described. As shown in FIG. 1, an abutting portion of the base surface 24 of the driving shaft 21 does not contribute to the deformation of the vibrator 19; however, in the present embodiment, the end portion 26 of the driving shaft 21 is thinner than the trunk 25, and the area of the end 24 is smaller than the cross sectional area of the trunk 25; therefore, a distance M from the periphery of the vibrator 19 to an abutting face of the driving shaft 21 can be increased. In other words, according to the present embodiment, a proportion of the area M that contributes to vibration (deformation) of the vibrator 19 can be increased as compared to a conventional case in which the end portion 26 is not tapered as shown in FIG. 4; therefore, the area of the vibrator 19 can be reduced even when obtaining the same deformation volume (vibration) as that in the conventional case. Therefore, size reduction of the linear driving device 7 can be achieved, while obtaining predetermined driving torque without changing the level of the driving power and the characteristic of the piezoelectric element.

Moreover, with regard to the driving shaft 21, the end portion 26 may be made thinner than the trunk 25, thus the mass of the driving shaft 21 receives almost no effect, and the area of the vibration member 17 can be reduced with little influence on the torque that acts on the zoom lens holder (movable body) 3. The driving shaft 21 with the end portion 26 being thinner than the trunk 25 can be easily manufactured by way of die forming or cutting without requiring any special processing.

In the present embodiment, the area of the base surface 24 of the driving shaft 21 is substantially half of the cross sectional area of the trunk 25; and in this case, even if a rectangular vibrator having a side length of about 3.9 mm in the conventional case (see FIG. 4) was replaced with the rectangular vibrator 19 with a side length of 2.5 mm (about 40% reduction in the area ratio), it was possible to cause the same torque to act on the zoom lens holder (movable body) 3. As a result of the experiment, in the driving shaft 21, the proportion of the area of the base surface 24 abutting with the vibrator 19, to the cross sectional area of the trunk 25 is preferably 1/3 to 3/4. This is because the fixing strength decreases when the proportion is smaller than 1/3, and it becomes difficult to increase the deformation area ratio of the vibrator when the proportion is greater than 3/4.

The end portion 26 of the driving shaft 21 is fixed to the vibrator 19 by way of the bonding agent 28, and a portion thus bonded has an adverse effect on deformation of the vibrator 19; however, as shown in (a) of FIG. 1, an area of a portion N of the bonding agent 28 running off the driving shaft 21 can be reduced as compared to the conventional case shown in FIG. 4; therefore, the adverse effect on deformation of the vibrator 19 due to the bonding 28 can be reduced.

Furthermore, since the bonding agent 28 bonds to an inclined surface 29 where the diameter of the driving shaft 21 is small, the area of bonding with the driving shaft 21 can be increased as compared to the conventional case, and thus strong bonding can be achieved.

It should be noted that it was possible to achieve smooth movement when voltage V was several tens of volts and frequency H was several tens of KHz in the electric current to be supplied to the vibration member 17.

In a case in which the zoom lens holder 3 is moved to the enlargement side (image-formation side), when electric current that is pulsed in the opposite direction is supplied to the piezoelectric element 23 of the vibration member 17, vibration is created and accompanied with amplification of the vibration by the vibrator 19, and the zoom lens holder 3 moves backward.

Moreover, with regard to the driving of the focus lens holder 5, similarly to the zoom lens holder 3, by supplying electric current of a predetermined pulse to the vibration member 17, the focus lens holder 5 can be moved forward or backward along the driving shaft 22.

The present invention is not limited to the aforementioned embodiment, and can be modified in various ways within a scope that does not depart from the sprit of the present invention.

For example, the piezoelectric element 23 and the vibrator 19 are not limited to a rectangular shape in a plan view, and may be a circular shape or a polygonal shape such as a hexagonal shape in a plan view, and the shape thereof is not limited thereto.

By providing the vibration members 17 to both ends of the driving shaft 21, the vibrators 19 of the vibration members 17 may be vibrated (deformed), respectively, in a synchronized manner. In this case, the torque acting on the zoom lens holder (movable body) 3 and the focus lens holder (movable body) 5 can be doubled.

What is claimed is:

1. A linear driving device, in which a movable body that is frictionally contact with a driving shaft slides along an axial direction of the driving shaft, the linear driving device comprising:
   a vibration member including a piezoelectric element that expands and contracts by applying electricity, and a vibrator made of a metal plate having elasticity, wherein the vibrator is fixed to the piezoelectric element by superimposing plate faces thereof; and
   a driving shaft having an end fixed to the vibration member, which vibrates in the axial direction due to vibration of the vibration member;
   wherein the driving shaft has a trunk along which the movable body slides, and an end portion fixed to the vibrator, a base surface of the end portion abuts with and is fixed to the vibrator, and an area of the abutting portion is smaller than a cross sectional area of the trunk.

2. The linear driving device according to claim 1, wherein the driving shaft is fixed to the vibrator by way of a bonding agent, and the bonding agent is packed between the end portion of the driving shaft and the vibrator.

3. The linear driving device according to claim 1, wherein the movable body is a lens support that supports a lens, and the lens support is moved in an optical axis direction of the lens by way of vibration of the vibration member.

\* \* \* \* \*